US011674983B2

(12) United States Patent
Nagao

(10) Patent No.: US 11,674,983 B2
(45) Date of Patent: *Jun. 13, 2023

(54) SIC SEMICONDUCTOR DEVICE WITH CURRENT SENSING CAPABILITY

(71) Applicant: ROHM CO., LTD., Kyoto (JP)

(72) Inventor: Katsuhisa Nagao, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/456,785

(22) Filed: Nov. 29, 2021

(65) Prior Publication Data

US 2022/0082593 A1 Mar. 17, 2022

Related U.S. Application Data

(63) Continuation of application No. 16/891,957, filed on Jun. 3, 2020, now Pat. No. 11,215,647, which is a (Continued)

(30) Foreign Application Priority Data

Dec. 18, 2015 (JP) .................................. 2015-247727

(51) Int. Cl.
*H01L 29/06* (2006.01)
*G01R 19/00* (2006.01)
(Continued)

(52) U.S. Cl.
CPC ........ *G01R 19/0092* (2013.01); *H01L 27/088* (2013.01); *H01L 29/0696* (2013.01);
(Continued)

(58) Field of Classification Search
CPC ............... H01L 27/088; H01L 29/0696; H01L 29/1608; H01L 29/78; H01L 29/7813; H01L 29/7815
See application file for complete search history.

(56) References Cited

U.S. PATENT DOCUMENTS 5,365,085 A 11/1994 Tokura et al.
5,654,560 A 8/1997 Nishizawa et al.
(Continued)

FOREIGN PATENT DOCUMENTS

JP S63136637 A 6/1988
JP H0846193 2/1996
(Continued)

OTHER PUBLICATIONS

Office Action issued for Chinese Patent Application No. 201680073975. 4, dated Dec. 3, 2021, 8 pages.
(Continued)

*Primary Examiner* — Eugene Lee
(74) *Attorney, Agent, or Firm* — Hamre, Schumann, Mueller & Larson, P.C.

(57) ABSTRACT

A SiC semiconductor device is provided that is capable of improving the detection accuracy of the current value of a principal current detected by a current sensing portion by restraining heat from escaping from the current sensing portion to a wiring member joined to a sensing-side surface electrode. The semiconductor device 1 includes a SiC semiconductor substrate, a source portion 27 including a principal-current-side unit cell 34, a current sensing portion 26 including a sensing-side unit cell 40, a source-side surface electrode 5 disposed above the source portion 27, and a sensing-side surface electrode 6 that is disposed above the current sensing portion 26 and that has a sensing-side pad 15 to which a sensing-side wire is joined, and, in the semiconductor device 1, the sensing-side unit cell 40 is disposed so as to avoid being positioned directly under the sensing-side pad 15.

19 Claims, 11 Drawing Sheets

Related U.S. Application Data continuation of application No. 16/061,967, filed as application No. PCT/JP2016/086445 on Dec. 7, 2016, now Pat. No. 10,705,123.

(51) Int. Cl.
*H01L 29/66* (2006.01)
*H01L 29/78* (2006.01)
*H01L 27/088* (2006.01)
*H01L 29/16* (2006.01)

(52) U.S. Cl.
CPC .... *H01L 29/1608* (2013.01); *H01L 29/66068* (2013.01); *H01L 29/78* (2013.01); *H01L 29/7813* (2013.01); *H01L 29/7815* (2013.01)

(56) References Cited

U.S. PATENT DOCUMENTS

| | | | |
|---|---|---|---|
| 6,140,680 | A | 10/2000 | Pulvirenti |
| 6,180,966 | B1 | 1/2001 | Kohno et al. |
| 8,207,580 | B2 | 6/2012 | Parthasarathy et al. |
| 9,006,819 | B2 | 4/2015 | Hino et al. |
| 9,076,805 | B2 | 7/2015 | Thiele et al. |
| 9,450,060 | B2 | 9/2016 | Hiyoshi et al. |
| 10,705,123 | B2 | 7/2020 | Nagao |
| 11,276,621 | B2 * | 3/2022 | Hoshi ................. H01L 29/1608 |
| 2005/0286194 | A1 | 12/2005 | Fujiki et al. |
| 2006/0073637 | A1 | 4/2006 | Yokoyama et al. |
| 2010/0219417 | A1 | 9/2010 | Miura et al. |
| 2011/0198587 | A1 | 8/2011 | Takeuchi |
| 2012/0224288 | A1 | 9/2012 | Uota et al. |
| 2013/0075760 | A1 | 3/2013 | Takaya et al. |
| 2013/0168700 | A1 | 7/2013 | Furukawa et al. |
| 2013/0313569 | A1 | 11/2013 | Usagawa |
| 2014/0124890 | A1 | 5/2014 | Fernando et al. |
| 2014/0225114 | A1 | 8/2014 | Furukawa et al. |
| 2015/0008450 | A1 * | 1/2015 | Suekawa ............. H01L 21/8252 257/77 |
| 2015/0029627 | A1 | 1/2015 | Mauder et al. |
| 2015/0333168 | A1 | 11/2015 | Hirler et al. |
| 2016/0079377 | A1 * | 3/2016 | Hutzler ............... H01L 29/7397 257/334 |
| 2016/0087094 | A1 | 3/2016 | Takaya et al. |
| 2016/0141403 | A1 | 5/2016 | Riegler |
| 2017/0110545 | A1 | 4/2017 | Nagao et al. |
| 2017/0111037 | A1 * | 4/2017 | Shiigi .................. H01L 23/535 |
| 2019/0057873 | A1 | 2/2019 | Sugahara et al. |

FOREIGN PATENT DOCUMENTS

| | | | |
|---|---|---|---|
| JP | H08203921 | | 8/1996 |
| JP | H10326897 | | 12/1998 |
| JP | H1174370 | | 3/1999 |
| JP | H11135391 | A | 5/1999 |
| JP | 2001203205 | A | 7/2001 |
| JP | 2002314086 | | 10/2002 |
| JP | 2005322781 | | 11/2005 |
| JP | 2007103656 | A | 4/2007 |
| JP | 2013098316 | * | 5/2013 |
| JP | 2015220334 | | 12/2015 |
| WO | 2011161721 | | 12/2011 |

OTHER PUBLICATIONS

International Preliminary Report on Patentabilty issued for International Patent Application No. PCT/JP2016/086445, dated Jun. 28, 2018, 14 pages including English translation.

International Search Report issued for International Patent Application No. PCT/JP2016/086445, dated Mar. 14, 2017, 5 pages including English translation.

Office Action issued for Japanese Patent Application No. 2017-556002, dated Oct. 22, 2020, 10 pages including English translation.

Office Action issued for German Patent Application No. 112016005768.7, dated May 20, 2022, 18 pages including informal English translation.

Office Action issued for Chinese Patent Application No. 201680073975.4, dated May 13, 2022, 13 pages including English machine translation.

Trial/Appeal Decision issued for Japanese Patent Application No. 2020-207091, dated Jun. 23, 2022, 84 pages including English machine translation.

Notice of Reasons for Refusal issued for Japanese Patent Application No. 2021-148258, dated Oct. 13, 2022, 16 pages including English machine translation.

Notice of Reasons for Refusal issued for Japanese Patent Application No. 2022-016155, dated Feb. 9, 2023, 8 pages including English machine translation.

* cited by examiner

SIC SEMICONDUCTOR DEVICE WITH CURRENT SENSING CAPABILITY

TECHNICAL FIELD

The present invention relates to a SiC semiconductor device that has a current sensing portion.

BACKGROUND ART

A semiconductor device that includes a current sensing portion to detect a current value of a principal current of a device is heretofore known, and semiconductor devices of, for example, Patent Documents 1 and 2 have been proposed.

PRIOR ART DOCUMENTS

Patent Documents

Patent Document 1: Japanese Patent Application Publication No. 8-46193
Patent Document 2: Japanese Patent Application Publication No. 11-74370

SUMMARY OF INVENTION

Technical Problem

Generally, a current sensing portion is formed smaller in area than a source portion through which a principal current flows. An area ratio between the current sensing portion and the source portion defines a sensing ratio when the principal current is detected. Additionally, the current value of the principal current is calculated by multiplying the value of an electric current that has actually flowed through the current sensing portion by the sensing ratio.

If conditions other than the area condition are completely identical with each other, the current value of the principal current might be able to be accurately detected only by considering the sensing ratio. However, in practice, differences exist with respect to a condition under which the current sensing portion and the source portion are placed, and the differences affect detection accuracy.

For example, a pad of the source portion is comparatively large, and the occupation area of a bonding wire with respect to the pad is small, and, on the other hand, a pad of the current sensing portion is comparatively small, and therefore the occupation area of the bonding wire with respect to the pad becomes large. This causes a difference in the amount of heat escaping through the bonding wire, and therefore there is a possibility that an error produced in on-resistance between the source portion and the current sensing portion will become large. This error in on-resistance affects the detection accuracy of the current value of the principal current.

An object of the present invention is to provide a SiC semiconductor device that is capable of improving the detection accuracy of the current value of a principal current detected by a current sensing portion by restraining heat from escaping from the current sensing portion to a wiring member joined to a sensing-side surface electrode.

Solution to Problem

A semiconductor device according to a preferred embodiment of the present invention includes a semiconductor layer made of SiC, a source portion that is formed at the semiconductor layer and that includes a first unit cell on a principal current side, a current sensing portion that is formed at the semiconductor layer and that includes a second unit cell on a current detection side, a source-side surface electrode disposed above the source portion, and a sensing-side surface electrode disposed so that at least one part of the sensing-side surface electrode includes a region positioned above the current sensing portion, and, in the semiconductor device, the second unit cell is disposed at a position below the sensing-side surface electrode and so as to avoid being positioned directly under a joint part of a wiring member.

According to this arrangement, the second unit cell on the current detection side is disposed so as to avoid being positioned directly under the joint part of the wiring member. This makes it possible to maintain a fixed distance between the second unit cell and the wiring member, and hence makes it possible to restrain heat generated at the second unit cell from escaping while being preferentially transmitted to the wiring member. Therefore, it is possible to lessen an error generated in on-resistance between the first unit cell of the source portion and the second unit cell of the current sensing portion. Additionally, the second unit cell is not placed directly under the joint part of the wiring member, and therefore it is possible to prevent a shock caused when the wiring member is joined to the sensing-side surface electrode from running directly to the second unit cell, and it is also possible to restrain the second unit cell from being broken. As a result thereof, it is possible to improve the detection accuracy of the current value of a principal current detected by the current sensing portion.

The use of the semiconductor layer made of SiC makes it possible to achieve an arrangement in which the second unit cell is disposed so as to avoid being positioned directly under the joint part of the wiring member as mentioned above. In other words, in a Si semiconductor device, the amount of flowing current per unit area is small, and therefore a cell area for a somewhat large sensing portion is required to set an appropriate sensing ratio (about 1000 to 2000) having high detection accuracy with respect to a source portion having a large area through which high current flows, and therefore it is difficult to form it so as to avoid being positioned directly thereunder. On the other hand, in the SiC semiconductor device, the amount of flowing current per unit area is large, and therefore it is possible to secure an appropriate sensing ratio even if the sensing portion is small in cell area with respect to the source portion, and therefore it is possible to form it so as to avoid being positioned directly thereunder.

The semiconductor device may include an interlayer insulating film disposed between the current sensing portion and the sensing-side surface electrode and a gate insulating film formed at a lower position than the interlayer insulating film, and, in the semiconductor device, the interlayer insulating film may be formed thicker than the gate insulating film.

According to this arrangement, it is possible to lessen a shock running to the second unit cell when the wiring member is joined to the sensing-side surface electrode. As a result, it is possible to secure the reliability of the detection accuracy of the current value of a principal current.

In the semiconductor device, the current sensing portion may be formed in a region surrounded by the source portion.

According to this arrangement, it is possible to bring the amount of heat generation of the current sensing portion close to that of the source portion, and therefore it is possible to lessen an error in on-resistance generated because of a difference in the amount of heat generation.

The semiconductor device may include a passivation film that selectively covers a portion positioned directly over the second unit cell of the sensing-side surface electrode and that has an opening by which a part of the sensing-side surface electrode is exposed as a sensing-side pad.

According to this arrangement, the portion positioned directly over the second unit cell and the sensing-side pad are clearly distinguished from each other when viewed from outside the semiconductor device, and therefore it is possible to prevent the wiring member from being erroneously joined to the portion positioned directly over the second unit cell. Therefore, it is possible to reliably maintain a fixed distance between the second unit cell and the wiring member.

In the semiconductor device, the first unit cell and the second unit cell may have mutually same cell structures, respectively.

According to this arrangement, it is possible to estimate a sensing ratio when the current value of the principal current is calculated from a cell ratio between the first unit cell and the second unit cell, and therefore it is possible to easily perform current detection.

In the semiconductor device, the current sensing portion may be formed at only one place in an in-plane direction of the semiconductor layer.

According to this arrangement, it is possible to achieve the space-saving of a surface part of the semiconductor layer.

In the semiconductor device, the interlayer insulating film may have a thickness of 1 μm or more.

According to this arrangement, it is possible to give sufficient shock resistance (for example, wire bonding resistance) to the interlayer insulating film.

The semiconductor device may include a gate-side surface electrode that is disposed on the semiconductor layer and that has a gate-side joint region to which a wiring member is joined, and, in the semiconductor device, the interlayer insulating film may also be disposed at a place directly under the gate-side joint region.

According to this arrangement, it is possible to form in the same process step an interlayer insulating film with which the source portion is covered and an interlayer insulating film with which the gate portion is covered, and therefore it is possible to shorten a manufacturing process.

In the semiconductor device, the interlayer insulating film may include a SiO$_2$ film, and the SiO$_2$ film may contain P (phosphorus) or B (boron).

The SiO$_2$ film is easily produced, and, if the SiO$_2$ film contains P (phosphorus) or B (boron), it is also possible to perform a reflow process after the film is produced. It is possible to easily flatten the interlayer insulating film (SiO$_2$ film) by the reflow process, and therefore it is possible to easily join the wiring member, which possibly affects the heat dissipation capability of the current sensing portion, according to a design plan.

In the semiconductor device, the sensing-side surface electrode may include an electrode having a layered structure in which Ti, TiN, and AlCu are stacked together in this order from the bottom.

According to this arrangement, the use of AlCu for the topmost surface of the sensing-side surface electrode makes it possible to give sufficient shock resistance (for example, wire bonding resistance) to the electrode.

The semiconductor device may include a gate-side surface electrode disposed on the semiconductor layer and a passivation film that has an opening by which a part of the sensing-side surface electrode is exposed as a sensing-side pad and an opening by which a part of the gate-side surface electrode is exposed as a gate-side pad, and in the semiconductor device, the sensing-side pad and the gate-side pad may be each formed so as to have a shape long in a same direction.

According to this arrangement, it is possible to extend and join the wiring members from the same direction to the sensing-side pad and to the gate-side pad, respectively, and therefore it is possible to easily lay the wiring members when a package is assembled.

DESCRIPTION OF EMBODIMENTS

Preferred embodiments of the present invention will be hereinafter described in detail with reference to the accompanying drawings.

Figure 1:
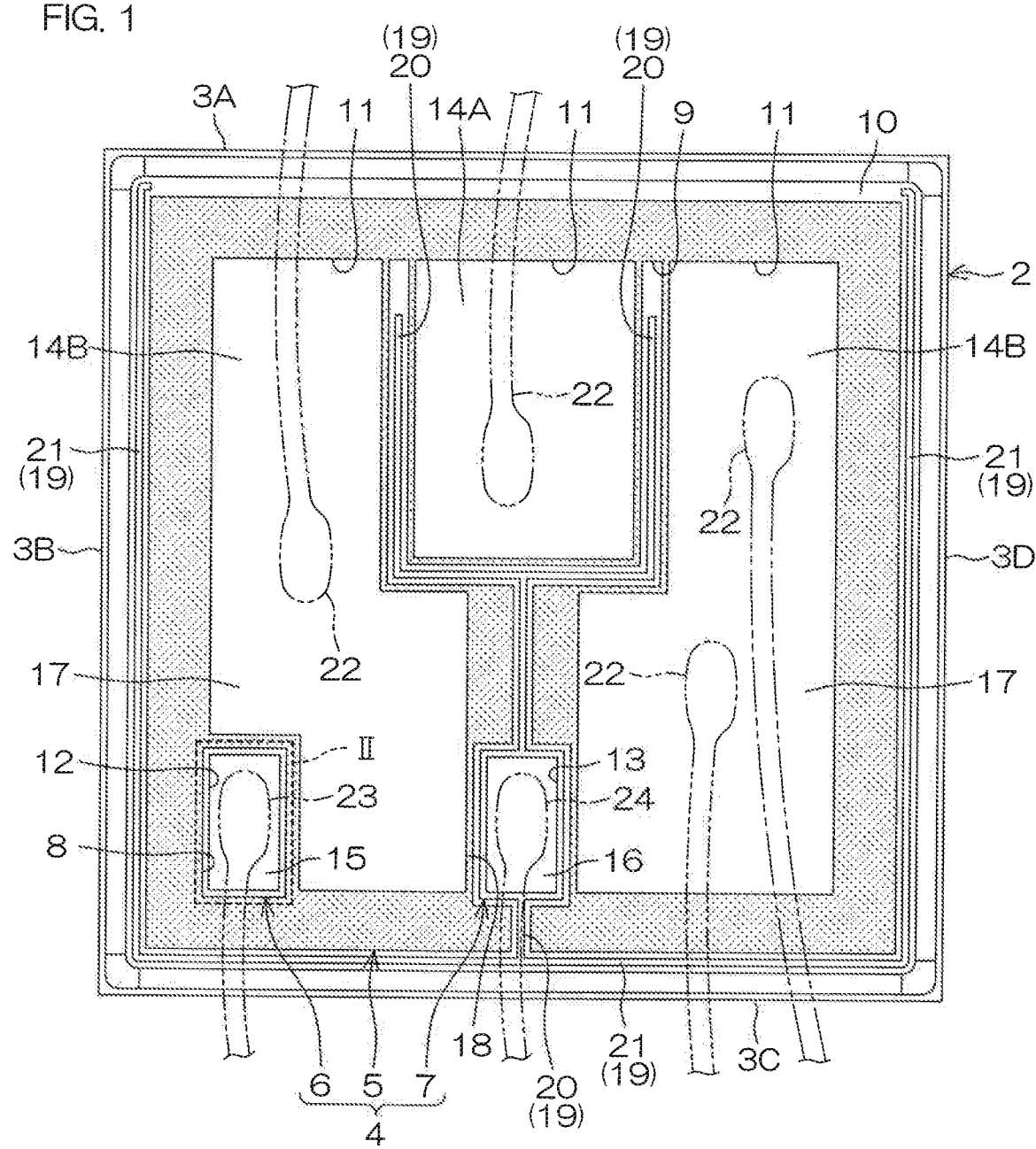
FIG. 1 is a schematic plan view of a semiconductor device according to a preferred embodiment of the present invention.

FIG. 1 is a schematic plan view of a semiconductor device 1 according to a preferred embodiment of the present invention.

The semiconductor device 1 includes a semiconductor substrate 2 that is an example of a semiconductor layer of the present invention and that is formed in a quadrangular shape in a plan view. The semiconductor substrate 2 has four sides 3A, 3B, 3C, and 3D in a plan view.

A plurality of surface electrode films 4 are formed on the semiconductor substrate 2 so as to be separated from each other. The surface electrode films 4 include a source-side surface electrode 5, a sensing-side surface electrode 6, and a gate-side surface electrode 7. The source-side surface electrode 5 is formed in most regions on the semiconductor substrate 2 (the hatched region of FIG. 1 and regions of source-side pads 14A, 14B, and 14B described later), and removal regions 8 and 9 for which a part of the source-side surface electrode 5 has been removed are formation regions of the sensing-side surface electrode 6 and the gate-side surface electrode 7, respectively. Both of the removal regions 8 and 9 are defined by being surrounded by the source-side surface electrode 5.

A passivation film 10 that wholly covers the plurality of surface electrode films 4 with the single film 10 is formed on the semiconductor substrate 2. The passivation film 10 has a plurality of pad openings 11, 12, and 13. The source-side surface electrode 5, the sensing-side surface electrode 6, and the gate-side surface electrode 7 are exposed from the pad openings 11, 12, and 13 as source-side pads 14A and 14B, as a sensing-side pad 15, and as a gate-side pad 16, respectively.

The plurality of source-side pads 14A and 14B are disposed so as to be separated from each other. In FIG. 1, the three source-side pads 14A, 14B, and 14B are provided on the semiconductor substrate 2. The source-side pad 14A that is one of the three source-side pads is disposed closer to a side 3A of the semiconductor substrate 2 in a central part in a direction along the side 3A, and the remaining source-side pads 14B and 14B are disposed on both sides of the source-side pad 14A, respectively. The source-side pads 14B and 14B disposed on both sides respectively have extension portions 17 and 17 that extend toward a side 3C opposite to the side 3A with respect to the source-side pad 14A disposed between the source-side pads 14B and 14B. The extension portions 17 face each other with an interval therebetween, and define a region 18 in which the gate-side pad 16 is disposed at a part adjacent to the source-side pad 14A disposed between the source-side pads 14B and 14B. Although the plurality of source-side pads 14A and 14B are separated from each other in appearance, these source-side pads 14A and 14B are connected to each other through the hatched region of FIG. 1 below the passivation film 10 so that the source-side pads 14A and 14B are united together and serve as the source-side surface electrode 5.

The sensing-side pad 15 is disposed only at one corner portion of the quadrangular semiconductor substrate 2. This makes it possible to achieve space-saving on the semiconductor substrate 2. The sensing-side pad 15 is formed in a shape that is long along the two sides 3B and 3D of the semiconductor substrate 2, and is surrounded by one of the two source-side pads 14B and 14B. In the sensing-side pad 15, a part of its periphery may be surrounded by the source-side pad 14B as shown in FIG. 1, or, alternatively, all of its periphery may be surrounded by the source-side pad 14B (not shown).

The gate-side pad 16 is disposed in the region 18 between the source-side pads 14B and 14B that face each other. The gate-side pad 16 is formed in a shape that is long along the sides 3B and 3D of the semiconductor substrate 2 in the same way as the sensing-side pad 15.

The gate-side surface electrode 7 additionally includes a gate finger 19 that extends from the gate-side pad 16. The gate finger 19 is covered with the passivation film 10. The gate finger 19 includes a central portion 20 that extends in a direction from the side 3C of the semiconductor substrate 2 toward the side 3A opposite to the side 3C so as to pass through the center of the source-side surface electrode 5 and a peripheral portion 21 that extends along a peripheral edge of the semiconductor substrate 2 (i.e., along the sides 3B, 3C, and 3D in FIG. 1) and that surrounds the source-side surface electrode 5.

A source-side wire 22, a sensing-side wire 23, and a gate-side wire 24 are connected to the source-side pads 14A and 14B, to the sensing-side pad 15, and to the gate-side pad 16, respectively. For example, aluminum wires are used as the wires 22 to 24. The aluminum wire is normally joined by not ball bonding but slender wedge bonding. Therefore, if the sensing-side pad 15 and the gate-side pad 16 are each formed in a shape long in the same direction as in FIG. 1, it is possible to extend and join the wires 23 and 24 from the same direction to the sensing-side pad 15 and to the gate-side pad 16, respectively. As a result, it is possible to easily lay the wires when a package is assembled.

With respect to the diameter of each of the wires 22 to 24, the diameter of the source-side wire 22 may be, for example, 300 µm to 500 µm, and the diameter of the sensing-side wire 23 and that of the gate-side wire 24 may be, for example, 100 µm to 200 µm.

A bonding wire is not necessarily required to be used as a wiring member by which the source-side pads 14A and 14B, the sensing-side pad 15, and the gate-side pad 16 are connected to the outside, and another wiring member, such as a bonding plate or a bonding ribbon, may be used as the wiring member.

Figure 2:
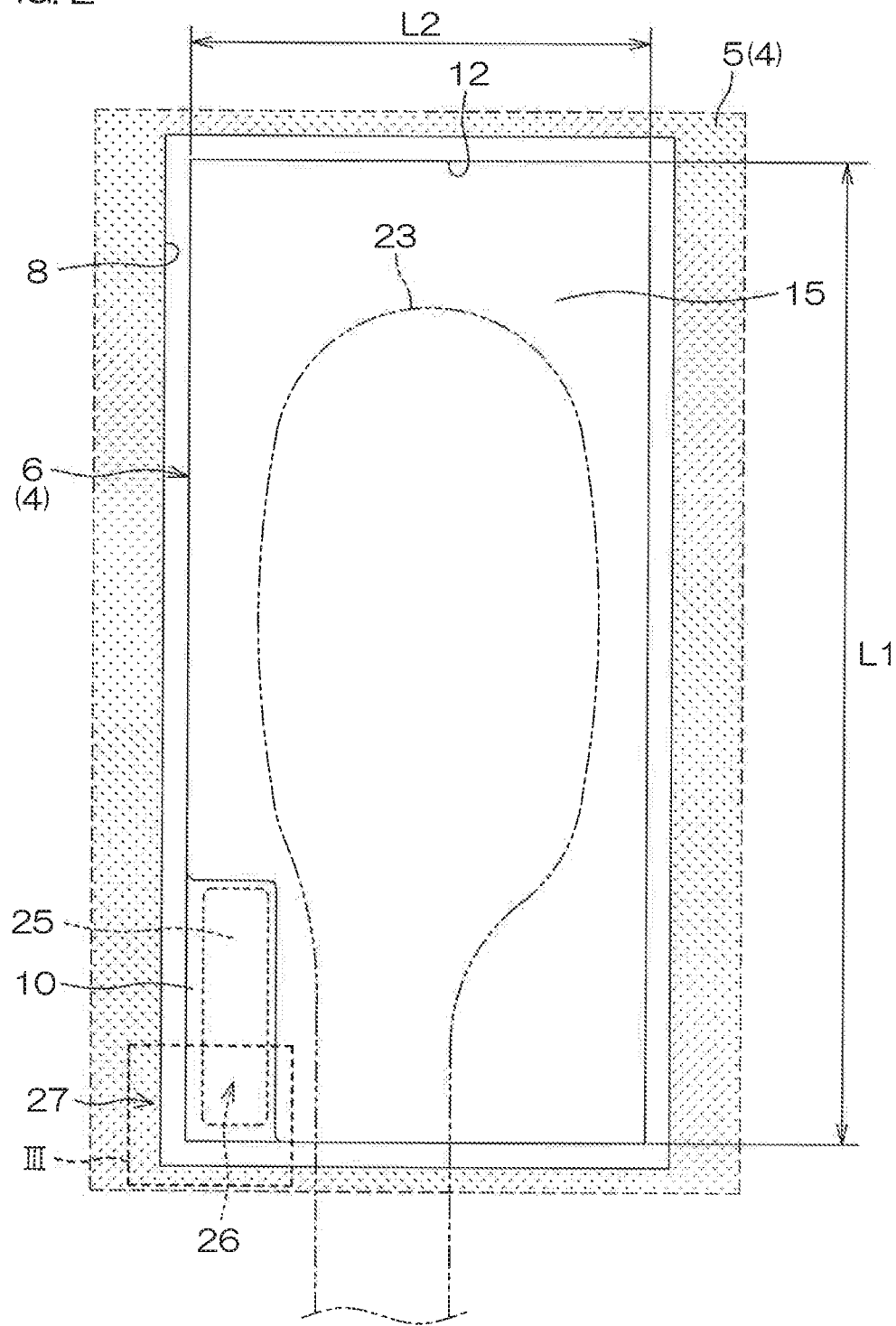
FIG. 2 is an enlarged view of a region surrounded by broken line II of FIG. 1.

FIG. 2 is an enlarged view of a region surrounded by broken line II of FIG. 1.

In appearance, the sensing-side surface electrode 6 is exposed as the sensing-side pad 15 formed in a substantially rectangular shape in a plan view in a state in which a part (in FIG. 2, one corner portion) of the sensing-side surface electrode 6 is covered with the passivation film 10 although the sensing-side surface electrode 6 is formed in a rectangular shape in a plan view as shown in FIG. 2. Preferably, the length L1 of a long side and the length L2 of a short side of the sensing-side pad 15 are 1.2 mm or less and 0.6 mm or less, respectively. This makes it possible to confine the size of the sensing-side pad 15 to 0.72 mm$^2$ or less, and hence makes it possible to restrain an increase in on-resistance of a sensing-side unit cell 40 (described later). Additionally, the sensing-side pad 15 is made slender by increasing the length L1 of the long side about twice as long as the length L2 of the short side, thus making it possible to easily join a bonding wire (sensing-side wire 23) by means of wedge bonding.

The region 25 covered with the passivation film 10 is formed in a rectangular shape in a plan view, and one short side and one long side of the region 25 form an extension portion of the short side and an extension portion of the long side of the sensing-side pad 15, respectively. The region 25 covered therewith is not necessarily required to be formed in a rectangular shape in a plan view, and may be formed in another shape (for example, square, circular, or triangular). Of course, likewise, its position is not necessarily required to be placed at a corner portion of the sensing-side surface electrode 6, and it may be placed, for example, between both ends of a side of the sensing-side surface electrode 6.

A current sensing portion 26 that serves as an aggregation of many sensing-side unit cells 40 (described later) is formed at a place directly under the covered region 25. On the other hand, the current sensing portion 26 is not formed at a place directly under the sensing-side pad 15. In other words, in the present preferred embodiment, the entirety of the current sensing portion 26 is formed so as to avoid being positioned directly under the sensing-side pad 15.

On the other hand, a source portion 27 that serves as an aggregation of many principal-current-side unit cells 34 (described later) is formed around the sensing-side surface electrode 6. The source portion 27 is formed at a place directly under the source-side surface electrode 5, and is formed so as to surround the sensing-side surface electrode 6 in a plan view. The source portion 27 may be formed at a place directly under the entirety of the source-side surface electrode 5 shown in FIG. 1 (not shown).

Figure 3:
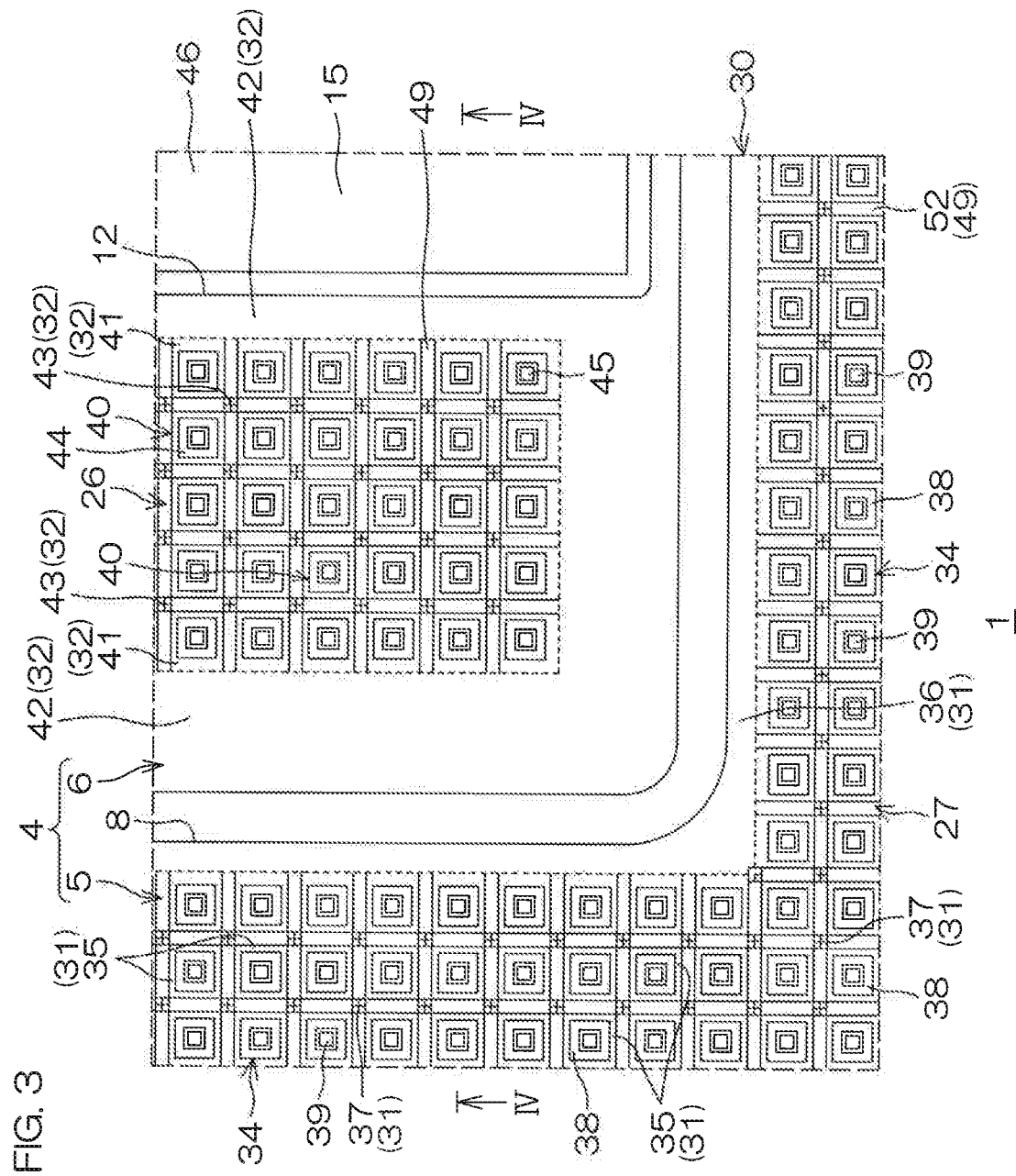
FIG. 3 is an enlarged view of a region surrounded by broken line III of FIG. 2.
Figure 4:
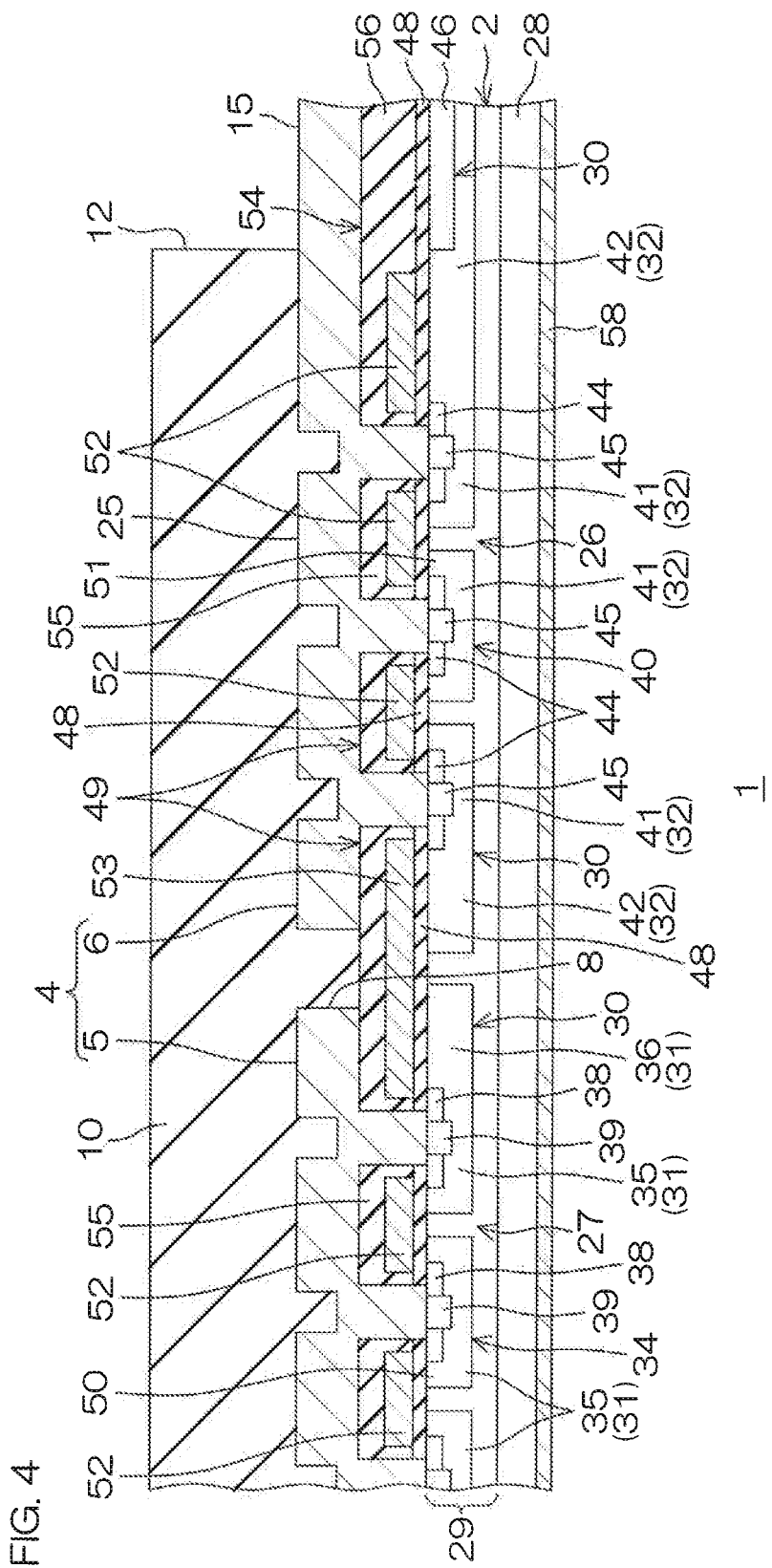
FIG. 4 is a cross-sectional view in a cutting plane along line IV-IV of FIG. 3.
Figure 5:
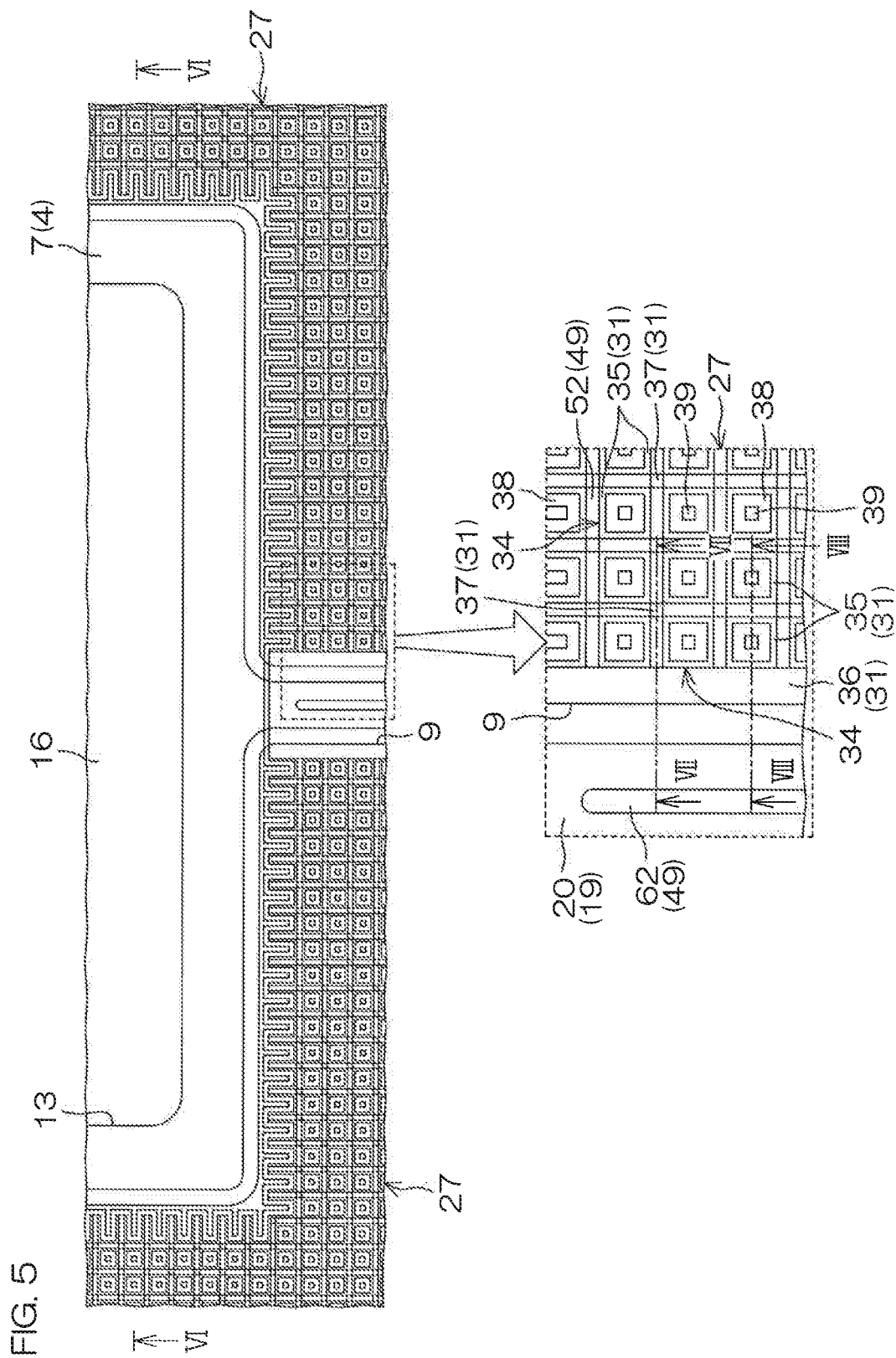
FIG. 5 is an enlarged view around a gate-side pad of FIG. 1.
Figure 6:
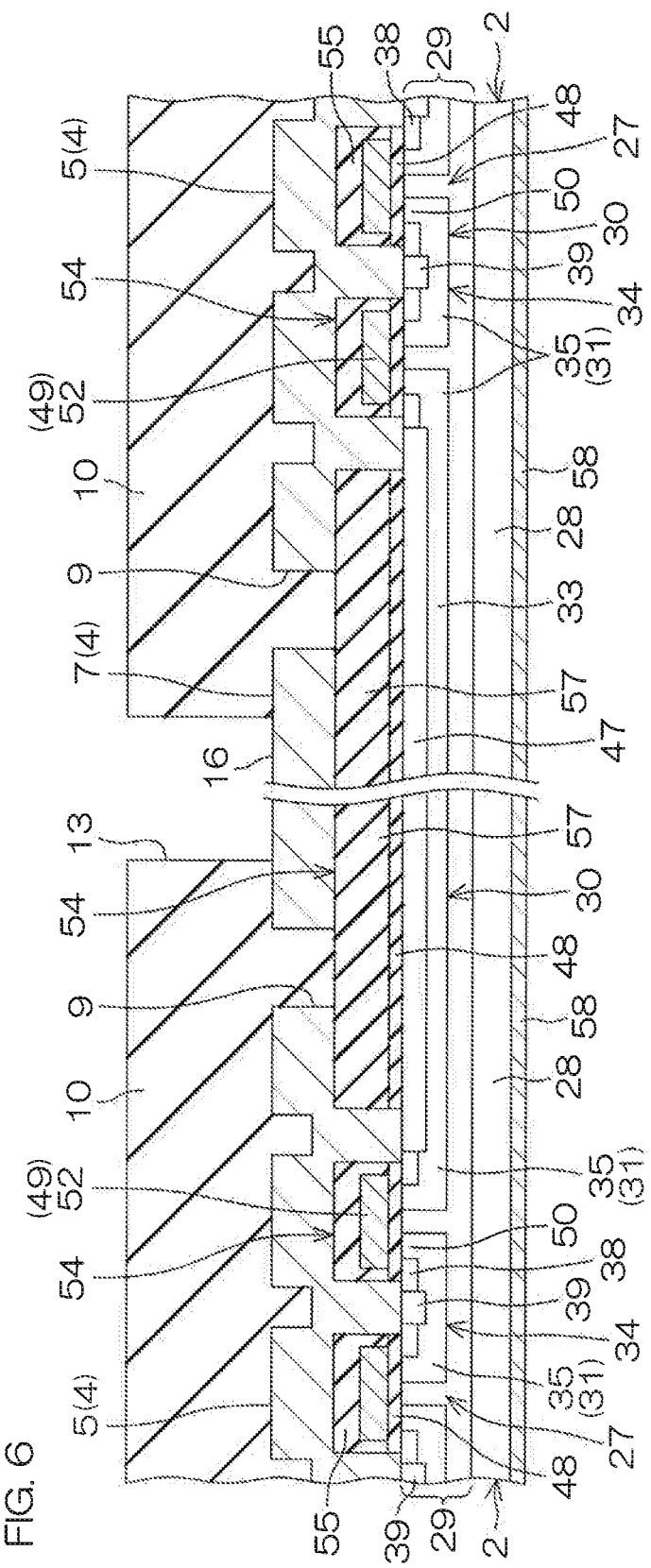
FIG. 6 is a cross-sectional view in a cutting plane along line VI-VI of FIG. 5.
Figure 7:
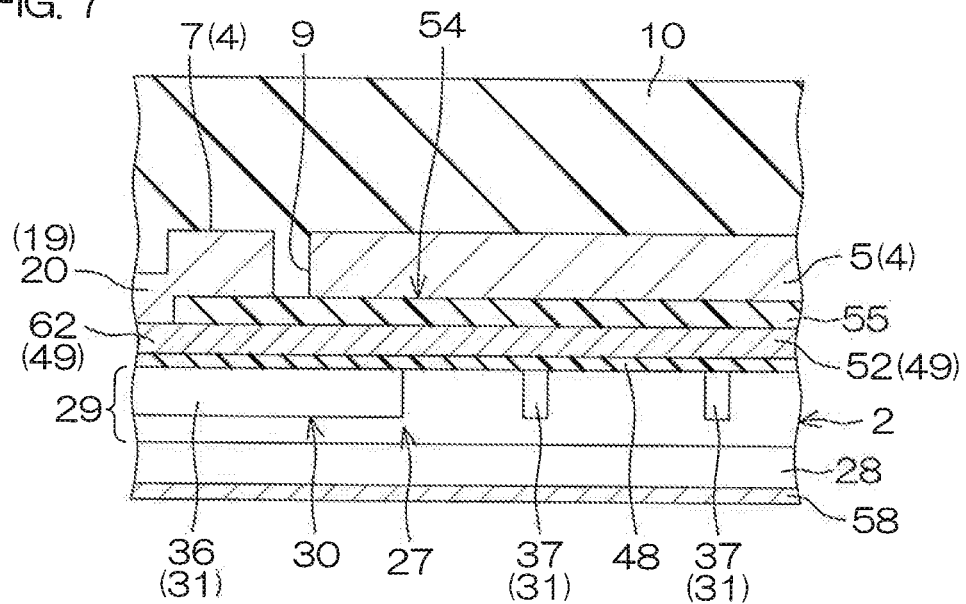
FIG. 7 is a cross-sectional view in a cutting plane along line VII-VII of FIG. 5.
Figure 8:
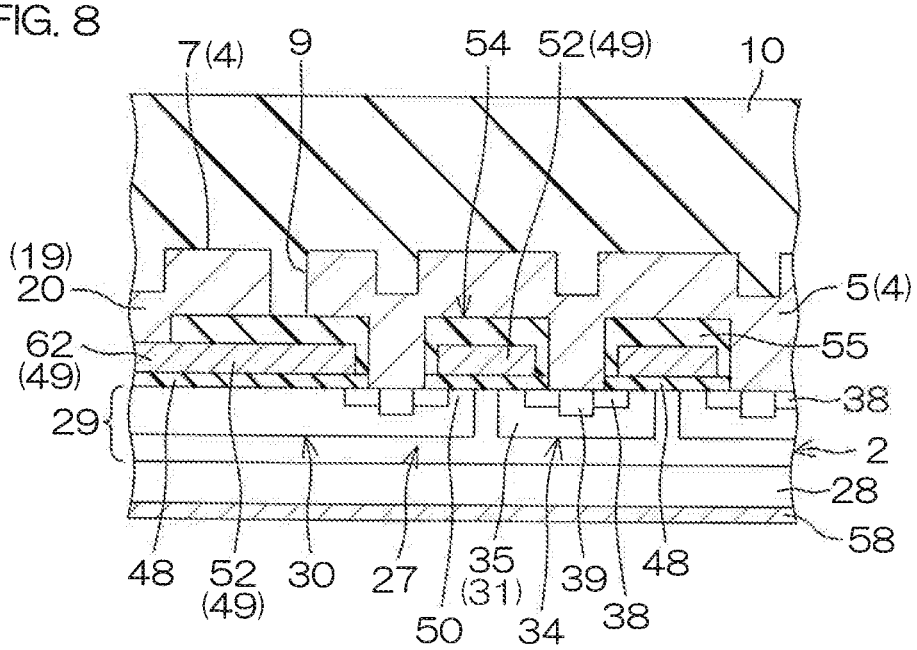
FIG. 8 is a cross-sectional view in a cutting plane along line VIII-VIII of FIG. 5.

FIG. 3 is an enlarged view of a region surrounded by broken line III of FIG. 2. FIG. 4 is a cross-sectional view in a cutting plane along line IV-IV of FIG. 3. FIG. 5 is an enlarged view around the gate-side pad 16 of FIG. 1. FIG. 6 is a cross-sectional view in a cutting plane along line VI-VI of FIG. 5. FIG. 7 is a cross-sectional view in a cutting plane along line VII-VII of FIG. 5. FIG. 8 is a cross-sectional view in a cutting plane along line VIII-VIII of FIG. 5. In FIG. 4, repeated parts in the lateral direction of FIG. 3 are partially excluded.

As shown in FIG. 4 and in FIG. 6 to FIG. 8, the semiconductor substrate 2 may be a SiC epitaxial substrate that includes a base substrate 28 and an epitaxial layer 29 on the base substrate 28. In the present preferred embodiment, the semiconductor substrate 2 includes a base substrate 28 made of n$^+$ type SiC (whose concentration is, for example, $1 \times 10^{17}$ cm$^{-3}$ to $1 \times 10^{19}$ cm$^{-3}$) and an epitaxial layer 29 made of n type SiC (whose concentration is, for example, $1 \times 10^{14}$ cm$^{-3}$ to $1 \times 10^{17}$ cm$^{-3}$).

A p$^-$ type well 30 (whose concentration is, for example, $1 \times 10^{14}$ cm$^{-3}$ to $1 \times 10^{19}$ cm$^{-3}$) is formed at a surface part of the n$^-$ type epitaxial layer 29. The p$^-$ type well 30 includes a principal-current-side p type body well 31, a sensing-side p$^-$ type body well 32, and a gate-side p type well 33. As shown in FIG. 4, the principal-current-side p type body well 31 and the sensing-side p type body well 32 are formed so as to be separated from each other. As shown in FIG. 6, the gate-side p$^-$ type well 33 is connected to the principal-current-side p type body well 31.

The principal-current-side p$^-$ type body well 31 includes a cell forming portion 35 that forms a principal-current-side unit cell 34 that is an example of a first unit cell of the present invention and a field forming portion 36 that has a comparatively wide region. In other words, each cell forming portion 35 defines the principal-current-side unit cell 34 that is a minimum unit through which a principal current flows.

As shown in FIG. 3 and FIG. 5, many cell forming portions 35 are arranged in a matrix manner, thus making up the source portion 27.

The field forming portion 36 is formed so as to surround the many cell forming portions 35, and connects adjoining cell forming portions 35 together while straddling between the adjoining cell forming portions 35 at an outer peripheral part of the source portion 27.

The principal-current-side p$^-$ type body well 31 additionally includes a connection portion 37 formed at an intersection of lattice regions partitioned by the matrix-shaped cell forming portions 35. This connection portion 37 connects the adjoining cell forming portions 35 together inside the source portion 27.

As thus described, the cell forming portions 35 are electrically connected together at the outer peripheral part and the inner part of the source portion 27 by means of the field forming portion 36 and the connection portion 37. Consequently, the many cell forming portions 35 are held at mutually equal electric potentials.

An n$^+$ type source region 38 is formed in an inner region of the cell forming portion 35, and a p$^+$ type body contact region 39 (whose concentration is, for example, $1 \times 10^{17}$ cm$^{-3}$ to $1 \times 10^{21}$ cm$^{-3}$) is formed in an inner region of the n$^+$ type source region 38 (whose concentration is, for example, $1 \times 10^{17}$ cm$^{-3}$ to $1 \times 10^{21}$ cm$^{-3}$).

The sensing-side p$-$ type body well 32 includes a cell forming portion 41 that forms the sensing-side unit cell 40 that is an example of a second unit cell of the present invention and a field forming portion 42 that has a comparatively wide region. In other words, each cell forming portion 41 defines the sensing-side unit cell 40 that is a minimum unit through which a principal current flows.

As shown in FIG. 3, many cell forming portions 41 are arranged in a matrix manner at places each of which is positioned so as to avoid being positioned directly under the sensing-side pad 15, thus making up the current sensing portion 26. The cell forming portion 41 has the same cell structure (size and pitch) as the principal-current-side cell forming portion 35.

The field forming portion 42 is formed so as to surround the many cell forming portions 41, and connects adjoining cell forming portions 41 together while straddling between the adjoining cell forming portions 41 at an outer peripheral part of the current sensing portion 26.

The sensing-side p$-$ type body well 32 additionally includes a connection portion 43 formed at an intersection of lattice regions partitioned by the matrix-shaped cell forming portions 41. This connection portion 43 connects the adjoining cell forming portions 41 together inside the current sensing portion 26.

As thus described, the cell forming portions 41 are electrically connected together at the outer peripheral part and the inner part of the current sensing portion 26 by means of the field forming portion 42 and the connection portion 43. Consequently, the many cell forming portions 41 are held at mutually equal electric potentials.

An n$^+$ type source region 44 (whose concentration is, for example, $1 \times 10^{17}$ cm$^{-3}$ to $1 \times 10^{21}$ cm$^{-3}$) is formed in an inner region of the cell forming portion 41, and a p$^+$ type body contact region 45 (whose concentration is, for example, $1 \times 10^{17}$ cm$^{-3}$ to $1 \times 10^{21}$ cm$^{-3}$) is formed in an inner region of the n$^+$ type source region 44.

The field forming portion 42 is formed so as to extend from an outer peripheral part of the cell forming portion 41 to the place positioned directly under the sensing-side pad 15. In the present preferred embodiment, the field forming portion 42 spreads over the entirety of the place directly under the sensing-side pad 15. In other words, in FIG. 2, it is formed over the entirety of a place positioned directly under the sensing-side surface electrode 6 having a substantially rectangular shape in a plan view excluding the covered region 25.

Additionally, a p$^+$ type region 46 (whose concentration is, for example, $1 \times 10^{17}$ cm$^{-3}$ to $1 \times 10^{21}$ cm$^{-3}$) is formed at a surface part of the field forming portion 42 at the place positioned directly under the sensing-side pad 15. The p$^+$ type region 46 is connected directly to the sensing-side surface electrode 6. The formation of the p$^+$ type region 46 makes it possible to stably keep the electric potential of the place positioned directly under the sensing-side pad 15 at a constant electric potential.

As shown in FIG. 6, the gate-side p$^-$ type well 33 is formed at a place positioned directly under the gate-side pad 16. A p$^+$ type region 47 (whose concentration is, for example, $1 \times 10^{17}$ cm$^{-3}$ to $1 \times 10^{21}$ cm$^{-3}$) is formed at a surface part of the gate-side p type well 33.

A gate insulating film 48 is formed on the semiconductor substrate 2, and a gate electrode 49 is formed on the gate insulating film 48. The gate insulating film 48 is made of, for example, silicon oxide (SiO$_2$), and the gate electrode 49 is made of, for example, polysilicon.

The gate electrode 49 includes a functional portion 52 that is formed along lattice regions partitioned by the matrix-shaped unit cells 34 and 40 and that straddles between adjoining unit cells 34 and 40 in the current sensing portion 26 and the source portion 27. Consequently, the gate electrode 49 faces channel regions 50 and 51 of the unit cells 34 and 40, respectively, with the gate insulating film 48 therebetween. The channel regions 50 and 51 are outer regions of the n⁺ type source regions 38 and 44 in the cell forming portions 35 and 41 of the p⁻ type body wells 31 and 32, respectively.

As shown in FIG. 4, the gate electrode 49 additionally includes a connection portion 53 in addition to the functional portion 52 facing the channel regions 50 and 51 of the unit cells 34 and 40, respectively. The connection portion 53 straddles between the current sensing portion 26 and the source portion 27 across the removal region 8 that is below the surface electrode film 4 and that is between the source-side surface electrode 5 and the sensing-side surface electrode 6. This connection portion 53 secures an electric connection between the functional portion 52 of the current sensing portion 26 and the functional portion 52 of the source portion 27. In other words, the gate electrode 49 serves as an electrode shared between the current sensing portion 26 and the source portion 27.

On the other hand, as shown in FIG. 7 and FIG. 8, the gate electrode 49 is connected to the gate-side surface electrode 7 in the gate finger 19 of the semiconductor device 1. In other words, the gate electrode 49 is formed so as to extend from the source portion 27 toward a lower part of the gate finger 19, and has a contact portion 62 at a place directly under the gate finger 19. Consequently, a gate voltage applied onto the gate-side pad 16 is also applied to the gate electrode 49 of the current sensing portion 26 through the contact portion 62 (FIG. 7) and through the connection portion 53 (FIG. 4).

Although the gate insulating film 48 is disposed below the gate electrode 49 in order to secure insulation between the gate electrode 49 and the semiconductor substrate 2, the gate insulating film 48 is also formed at a place directly under the sensing-side pad 15 and at a place directly under the gate-side pad 16 in the present preferred embodiment. As shown in FIG. 4 and FIG. 7, the gate insulating film 48 is made of an extension portion that is continuous with the gate insulating film 48 positioned directly under the functional portion 52 of the gate electrode 49.

An interlayer insulating film 54 is formed on the semiconductor substrate 2 so as to cover the gate electrode 49. The interlayer insulating film 54 is made of, for example, silicon oxide ($SiO_2$), and, preferably, contains P (phosphorus) or B (boron). In other words, the interlayer insulating film 54 may be BPSG (Boron Phosphorus Silicon Glass) or may be PSG (Phosphorus Silicon Glass). A $SiO_2$ film is easily produced, and, if this $SiO_2$ film contains P (phosphorus) or B (boron), it is also possible to perform a reflow process after the film is produced. The reflow process makes it possible to easily flatten the interlayer insulating film 54 ($SiO_2$ film), and hence makes it possible to easily join the sensing-side wire 23, which possibly affects the heat dissipation capability of the current sensing portion 26, according to a design plan.

The interlayer insulating film 54 integrally includes a first part 55 with which the gate electrode 49 is covered in the current sensing portion 26 and in the source portion 27, a second part 56 disposed at a place directly under the sensing-side pad 15, and a third part 57 disposed at a place directly under the gate-side pad 16. It is possible to give sufficient shock resistance (for example, wire bonding resistance) to the interlayer insulating film 54 by thickening the interlayer insulating film 54 positioned directly under the sensing-side pad 15 and the interlayer insulating film 54 positioned directly under the gate-side pad 16.

The surface electrode film 4 (the source-side surface electrode 5, the sensing-side surface electrode 6, and the gate-side surface electrode 7) is formed on the interlayer insulating film 54. The source-side surface electrode 5 passes through the interlayer insulating film 54 and through the gate insulating film 48, and is connected to the n⁺ type source region 38 and to the p⁺ type body contact region 39. The sensing-side surface electrode 6 passes through the interlayer insulating film 54 and through the gate insulating film 48, and is connected to the n⁺ type source region 44 and to the p+ type body contact region 45. The gate-side surface electrode 7 (the gate finger 19) passes through the interlayer insulating film 54, and is connected to the gate electrode 49.

The surface electrode film 4 may be an electrode film having a layered structure in which, for example, Ti, TiN, and AlCu are stacked together in this order from the bottom (i.e., from the semiconductor-substrate-2 side). The use of AlCu for the topmost surface of the surface electrode film 4 makes it possible to give more sufficient shock resistance (for example, wire bonding resistance) to the electrode film 4 than the use of Al.

The passivation film 10 is formed on the surface electrode film 4. The passivation film 10 may be made of, for example, silicon nitride (SiN). The pad openings 11 to 13 are formed in the passivation film 10 as described above.

A drain electrode 58 is formed on a rear surface of the semiconductor substrate 2. The drain electrode 58 may be an electrode film having a layered structure in which Ti, Ni, Au, and Ag are stacked together in this order from the semiconductor-substrate-2 side. The drain electrode 58 serves as an electrode shared between the current sensing portion 26 and the source portion 27.

Figure 9:
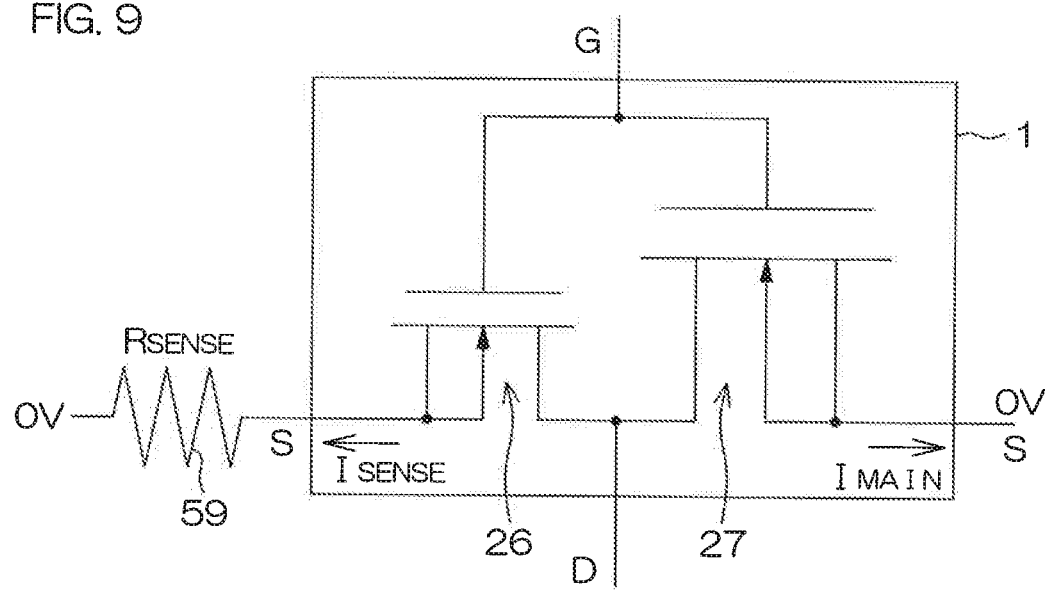
FIG. 9 is a circuit diagram to describe current detection in the semiconductor device.

Next, as an example, a method for detecting an electric current in the semiconductor device 1 will be described with reference to FIG. 9. FIG. 9 is a circuit diagram to describe current detection in the semiconductor device 1.

As shown in FIG. 9, the semiconductor device 1 has the principal-current-side source portion 27 and the current-detection-side current sensing portion 26 both of which are included in one chip. A detection resistor 59 is connected to a source S of the current sensing portion 26. The detection resistor 59 may be built into a module together with the semiconductor device 1 when the semiconductor device 1 is built into the module or it may be built into the inside of the semiconductor device 1, for example. A gate G and a drain D are shared between the current sensing portion 26 and the source portion 27 as described above.

A voltage larger than a threshold value is applied to the gate G in a state in which a voltage is applied between the source S and the drain D, and, as a result, an electric current flows between the source S and the drain D, and the semiconductor device 1 reaches an ON state. Consequently, a detection current $I_{SENSE}$ flows through the current sensing portion 26. On the other hand, a principal current $I_{MAIN}$ flows through the source portion 27.

Whether the principal current is a short-circuit current is determined by monitoring whether the voltage $V_{SENSE}$ of the detection resistor 59 has exceeded a predetermined threshold value. The resistance $R_{SENSE}$ of the detection resistor 59 is fixed, and therefore the voltage $V_{SENSE}$ becomes higher in proportion to an increase in the detection current $I_{SENSE}$. Therefore, the fact that the voltage $V_{SENSE}$ has exceeded the threshold value denotes that an excessive detection current $I_{SENSE}$ is flowing, and hence indicates that the current value $I_{MAIN}$ of the principal current calculated based on a sensing ratio between the current sensing portion 26 and the source portion 27 is also in an excessive state.

In the aforementioned detection method, if the principal current $I_{MAIN}$ that has actually flowed and the principal current $I_{MAIN}$ that is calculated by multiplying the detection current $I_{SENSE}$ by the sensing ratio are equal to each other, it is possible to accurately perform the short-circuit detection, and it is possible to shut off the gate voltage at an appropriate timing.

However, as shown in FIG. 1, the source-side pads 14A and 14B are comparatively large, and the occupation area of the source-side wire 22 with respect to the pads 14A and 14B is a small, and, on the other hand, the sensing-side pad 15 is comparatively small, and therefore the occupation area of the sensing-side wire 23 with respect to the sensing-side pad 15 becomes large. This causes a difference in the amount of heat escaping through the wires 22 and 23, and therefore there is a possibility that an error produced in on-resistance between the source portion 27 and the current sensing portion 26 will become larger. As a result, there is a case in which an excessive detection current $I_{SENSE}$ flows to the current-detection side although the principal current $I_{MAIN}$ is not a short-circuit current in actuality. In this case, short-circuit detection is strictly based on the voltage $V_{SENSE}$ of the current-detection-side detection resistor 59, and therefore there is a fear that it will be determined that it is a short circuit even when there is no need, and the gate voltage will be shut off.

Therefore, according to the semiconductor device 1, the current sensing portion 26 is disposed so as to avoid being positioned directly under the sensing-side pad 15 as shown in FIG. 2. This makes it possible to maintain a fixed distance between the current sensing portion 26 and the sensing-side wire 23 when the sensing-side wire 23 (FIG. 1) is joined to the sensing-side pad 15, and hence makes it possible to restrain heat generated at the current sensing portion 26 from escaping while being preferentially transmitted to the sensing-side wire 23. Therefore, it is possible to lessen an error generated in on-resistance between the principal-current-side unit cell 34 of the source portion 27 and the sensing-side unit cell 40 of the current sensing portion 26. Additionally, the current sensing portion 26 is not positioned directly under the sensing-side pad 15, and therefore it is possible to prevent a shock caused when the sensing-side wire 23 is joined to the sensing-side pad 15 from running directly to the current sensing portion 26, and it is also possible to restrain the current sensing portion 26 from being broken. As a result thereof, it is possible to improve the detection accuracy of the current value of a principal current detected by the current sensing portion 26.

The use of the semiconductor substrate 2 made of SiC makes it possible to achieve an arrangement in which the current sensing portion 26 is disposed so as to avoid being positioned directly under the sensing-side pad 15 as mentioned above. In other words, in a Si semiconductor device, the amount of flowing current per unit area is small, and therefore a cell area for a somewhat large sensing portion is required to set an appropriate sensing ratio (about 1000 to 2000) having high detection accuracy with respect to a source portion having a large area through which a high current flows, and therefore it is difficult to form it so as to avoid being positioned directly thereunder. On the other hand, in the SiC semiconductor device, the amount of flowing current per unit area is large, and therefore it is possible to secure an appropriate sensing ratio even if the sensing portion is small in cell area with respect to the source portion, and therefore it is possible to form it so as to avoid being positioned directly thereunder.

Additionally, in the present preferred embodiment, the current sensing portion 26 is surrounded by the source portion 27 as shown in FIG. 3, and therefore it is possible to bring the amount of heat generation of the current sensing portion 26 close to that of the source portion 27. Therefore, it is possible to lessen an error in on-resistance generated because of a difference in the amount of heat generation.

Additionally, in the present preferred embodiment, the entirety of the current sensing portion 26 is covered with the covered region 25 by the passivation film 10 as shown in FIG. 2, and a portion positioned directly over the current sensing portion 26 and the sensing-side pad 15 are clearly distinguished from each other when viewed from outside the semiconductor device 1. Therefore, it is possible to prevent the sensing-side wire 23 form being erroneously joined to the portion positioned directly over the current sensing portion 26. It is possible to reliably maintain a fixed distance between the current sensing portion 26 and the sensing-side wire 23.

Additionally, in the present preferred embodiment, the interlayer insulating film 54 has the second part 56 that is comparatively thick (for example, 1 μm or more) at a place directly under the sensing-side pad 15 as shown in FIG. 4 and FIG. 5. This makes it possible to lessen a shock running to the current sensing portion 26 when the sensing-side wire 23 is joined to the sensing-side pad 15. As a result, it is possible to secure the reliability of the detection accuracy of the current value of a principal current.

Figure 10:
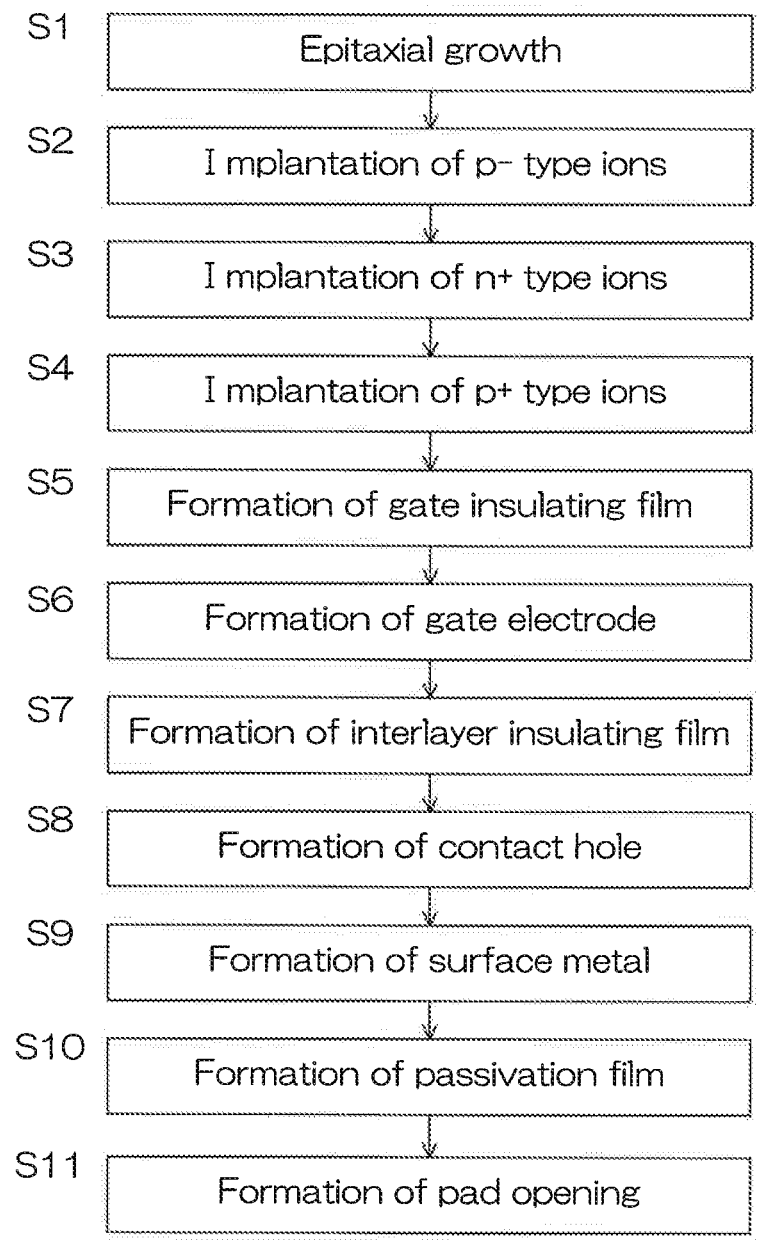
FIG. 10 is a flowchart showing a manufacturing process of the semiconductor device.

Next, a method for manufacturing the semiconductor device 1 will be described with reference to FIG. 10.

For example, first, the n type epitaxial layer 29 is formed on the $n^+$ type base substrate 28 by means of epitaxial growth, so that the semiconductor substrate 2 is formed (step S1).

Thereafter, p type impurity ions are selectively implanted into a surface part of the semiconductor substrate 2, and, as a result, the $p^-$ type well 30 is formed (step S2).

Thereafter, n type impurity ions are selectively implanted into each of the cell forming portions 35 and 41, and, as a result, the $n^+$ type source regions 38 and 44 are formed (step S3).

Thereafter, p type impurity ions are selectively implanted into the $p^-$ type well 30, and, as a result, the $p^+$ type body contact regions 39, 45 and the $p^+$ type regions 46, 47 are formed (step S4).

Thereafter, the gate insulating film 48 is formed on the surface of the semiconductor substrate 2 by means of, for example, thermal oxidation (step S5).

Thereafter, polysilicon is deposited on the semiconductor substrate 2 according to, for example, a CVD method, and the gate electrode 49 is formed thereon by means of patterning (step S6).

Thereafter, the interlayer insulating film 54 is formed on the semiconductor substrate 2 according to, for example, the CVD method (step S7).

Thereafter, a contact hole that passes through the interlayer insulating film 54 and through the gate insulating film 48 is formed, and then the surface electrode film 4 is formed according to, for example, a sputtering method (step S8 and step S9).

Thereafter, the passivation film 10 with which the surface electrode film 4 is covered is formed, and then the pad openings 11, 12, and 13 are formed by means of patterning (step S10 and step S11).

Through these steps, the aforementioned semiconductor device 1 is obtained.

Although the present invention has been described as above, the present invention can be embodied in other modes.

Figure 11:
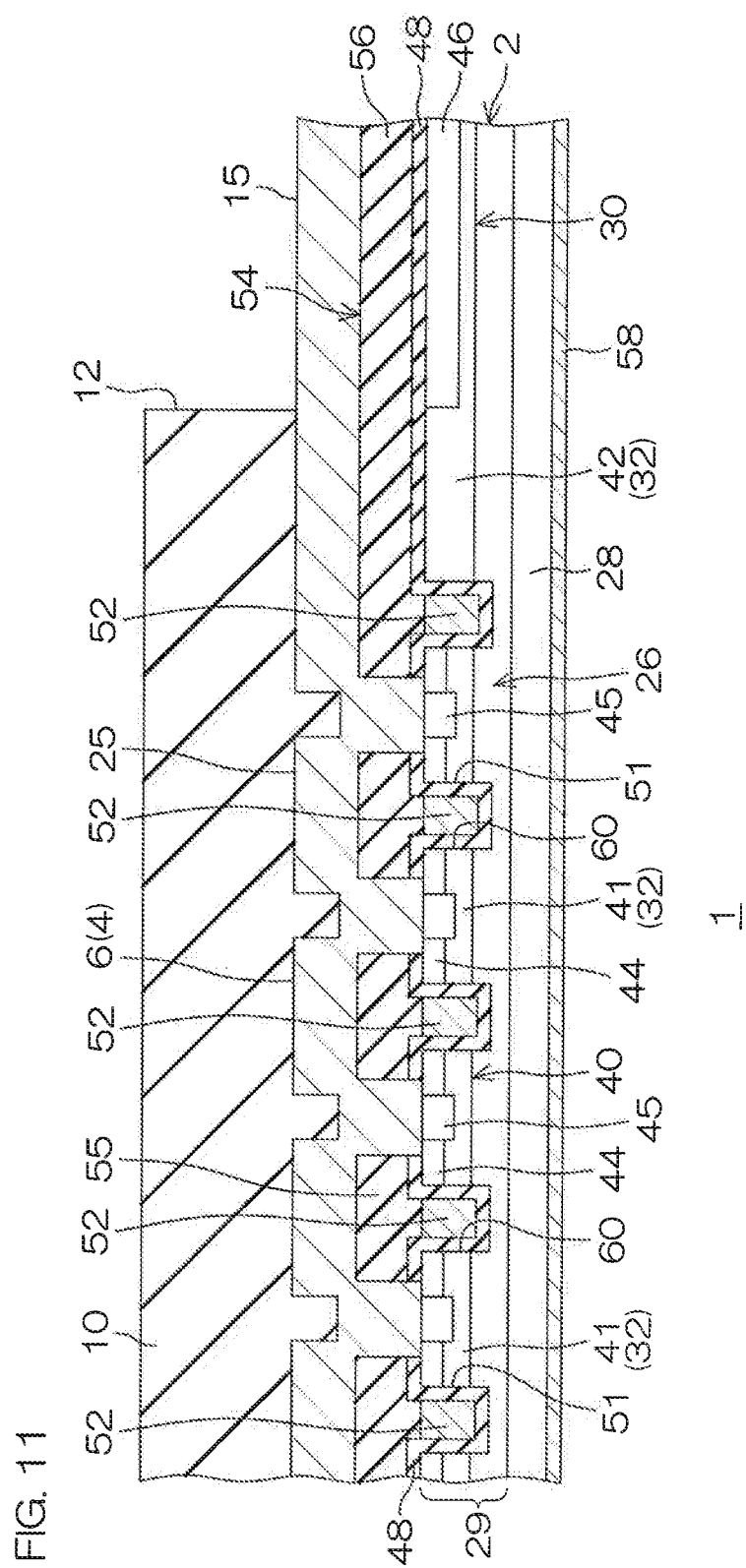
FIG. 11 is a view showing a modification of a gate structure of the semiconductor device.

For example, the gate structure of the semiconductor device 1 may be a trench gate structure shown in FIG. 11 without being limited to the planar gate structure shown in FIG. 4. In the trench gate structure, a gate trench 60 is formed in the semiconductor substrate 2, and a gate electrode 49 is embedded in its inside. In this case, the gate electrode 49 is not convex on the semiconductor substrate 2, and therefore the first part 55 and the second part 56 of the interlayer insulating film 54 may be equal to each other in thickness.

Figure 12:
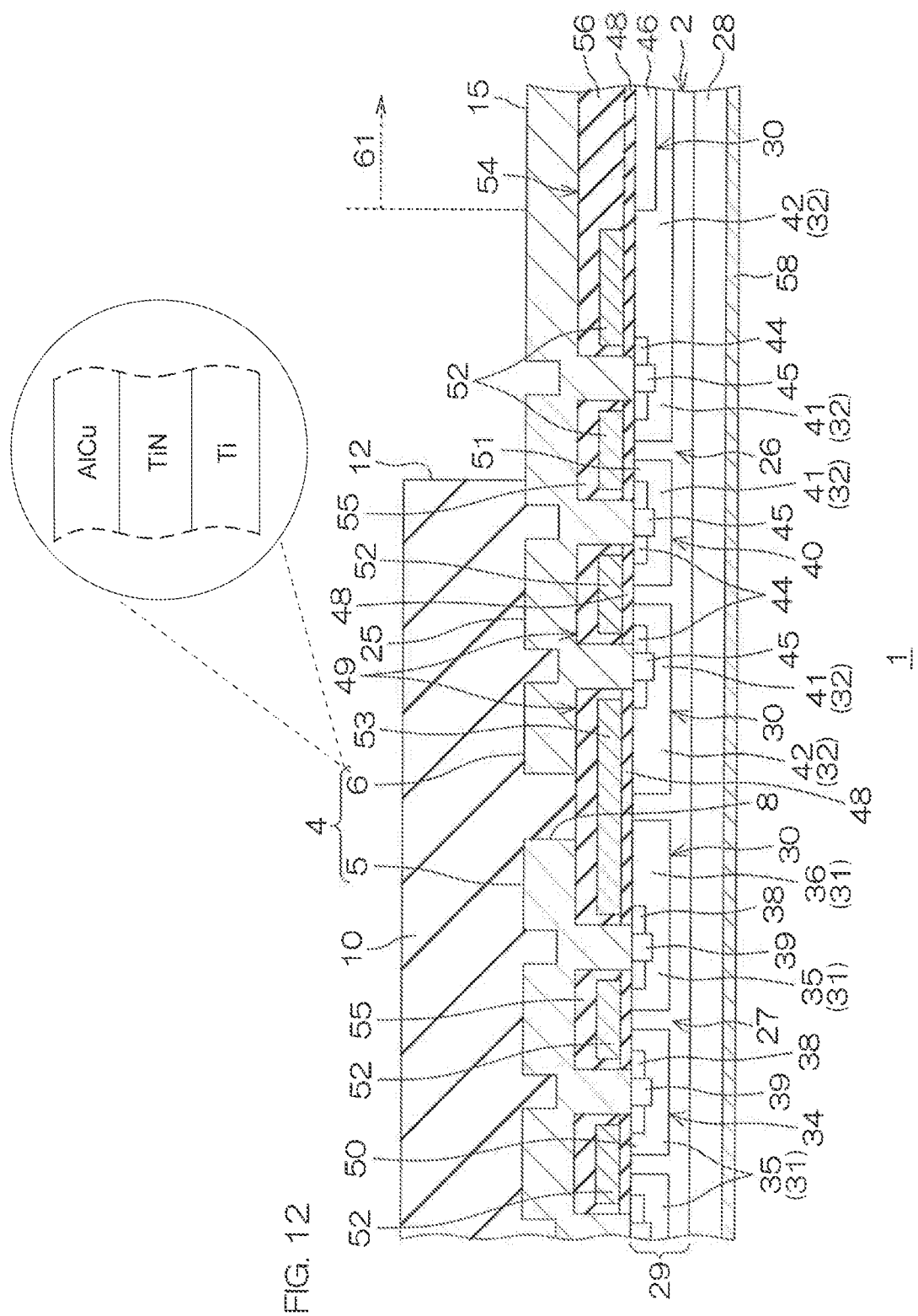
FIG. 12 is a view showing a modification of a sensing-side pad of the semiconductor device.

Additionally, the current sensing portion 26 is not necessarily required to have the arrangement of FIG. 2 in which its entirety is covered with the passivation film 10, and only one part of the current sensing portion 26 may be covered with the passivation film 10 as shown in FIG. 12. In this case, the current sensing portion 26 partially overlaps with a portion positioned directly under the sensing-side pad 15, and yet it is recommended to virtually set a joint region 61 of the sensing-side wire 23 in the sensing-side pad 15 at a position exclusive of the position of the current sensing portion 26. In other words, the sensing-side joint region of the present invention is not necessarily required to coincide with the sensing-side pad 15.

Besides, various design changes can be made within the scope of the subject matter described in the claims.

The present application corresponds to Japanese Patent Application No. 2015-247727 filed with the Japan Patent Office on Dec. 18, 2015, and the entire disclosure of the application is incorporated herein by reference.

REFERENCE SIGNS LIST

1 Semiconductor device
2 Semiconductor substrate
4 Surface electrode film
5 Source-side surface electrode
6 Sensing-side surface electrode
7 Gate-side surface electrode
10 Passivation film
12 Pad opening
15 Sensing-side pad
23 Sensing-side wire
26 Current sensing portion
27 Source portion
34 Principal-current-side unit cell
40 Sensing-side unit cell
54 Interlayer insulating film
55 First part
56 Second part
57 Third part
61 Joint region

The invention claimed is:

1. A semiconductor device comprising:
a semiconductor chip having a first surface and a second surface;
a first element portion that is formed at a side of the first surface of the semiconductor chip and that includes a first unit cell on a principal current side;
a current sensing portion that is formed at the side of the first surface of the semiconductor chip and that includes a second unit cell on a current detection side;
a first element-side surface electrode disposed above the first element portion;
a sensing-side surface electrode disposed so that at least one part of the sensing-side surface electrode includes a region positioned above the current sensing portion;
a first element-side wire joined to the first element-side surface electrode;
a sensing-side wire joined to the sensing-side surface electrode, the sensing-side wire being thinner than the first element-side wire; and
a passivation film that selectively covers a portion positioned directly over the second unit cell of the sensing-side surface electrode and that has a first opening by which a part of the sensing-side surface electrode is exposed as a sensing-side pad,
wherein the second unit cell is disposed at a position below the sensing-side surface electrode and so as to avoid being positioned directly under a joint part of the sensing-side wire, and
both of the current sensing portion and the sensing-side pad are placed along an edge of the semiconductor chip.

2. The semiconductor device according to claim 1, wherein the current sensing portion is smaller than the sensing-side pad.

3. The semiconductor device according to claim 2, wherein the sensing-side wire is shorter than the first element-side wire.

4. The semiconductor device according to claim 3, wherein the sensing-side wire and the first element-side wire extend in difference directions each other from the semiconductor chip.

5. The semiconductor device according to claim 4, further comprising a pair of second edges extending in a perpendicular direction to the edge of the semiconductor chip along which the current sensing portion is placed, wherein
the current sensing portion is positioned closer to a middle point between the pair of second edges than to the pair of second edges.

6. The semiconductor device according to claim 5, further comprising:
an interlayer insulating film disposed between the current sensing portion and the sensing-side surface electrode; and
a surface insulating film of the semiconductor chip formed at a lower position than the interlayer insulating film,
wherein the interlayer insulating film is formed thicker than the surface insulating film.

7. The semiconductor device according to claim 5, wherein the current sensing portion is formed in a region surrounded by the first element portion.

8. The semiconductor device according to claim 5, wherein the first unit cell and the second unit cell have mutually same cell structures, respectively.

9. The semiconductor device according to claim 5, wherein the current sensing portion is formed at only one place in an in-plane direction of the semiconductor chip.

10. The semiconductor device according to claim 6, wherein the interlayer insulating film has a thickness of 1 µm or more.

11. The semiconductor device according to claim 6, wherein
the first element portion and the current sensing portion are switching elements having control terminals, respectively, and
the semiconductor device further comprises a control terminal-side surface electrode that is disposed on the semiconductor chip and that has a control terminal-side joint region to which a wiring member is joined, wherein the interlayer insulating film is also disposed at a place directly under the control terminal-side joint region.

12. The semiconductor device according to claim 6, wherein the interlayer insulating film includes a $SiO_2$ film.

13. The semiconductor device according to claim 12, wherein the $SiO_2$ film contains P (phosphorus).

14. The semiconductor device according to claim 12, wherein the $SiO_2$ film contains B (boron).

15. The semiconductor device according to claim 5, wherein the sensing-side surface electrode includes an electrode having a layered structure in which Ti, TiN, and AlCu are stacked together in this order from a bottom of the layered structure to a top of the layered structure.

16. The semiconductor device according to claim 1, wherein
the first element portion and the current sensing portion are switching elements having control terminals, respectively,
at least one of the first element portion and the current sensing portion includes a control terminal-side surface electrode that is disposed on the semiconductor chip,
the passivation film has a second opening by which a part of the control terminal-side surface electrode is exposed as a control terminal-side pad, and
wherein the sensing-side pad and the control terminal-side pad are each formed so as to have a shape long in a same direction.

17. The semiconductor device according to claim 5, the sensing-side pad has a first length of a long side of 1.2 mm or less and a second length of a short side of 0.6 mm or less.

18. The semiconductor device according to claim 5, wherein
the sensing-side surface electrode is formed in a quadrangular shape in a plan view such that a part of the sensing-side surface electrode is a covered region which is covered with the passivation film,
a recess is formed by denting a part of at least one side of the sensing-side surface electrode such that the covering region is formed in the recess in plan view, and
the current sensing portion is formed directly under the covered region.

19. The semiconductor device according to claim 5, wherein the sensing-side wire has a diameter from 100 μm to 200 μm.

* * * * *